(12) United States Patent
Ding et al.

(10) Patent No.: US 9,857,419 B2
(45) Date of Patent: Jan. 2, 2018

(54) MICRO-VISION ALIGNMENT SYSTEM WITH GUIDING RINGS FOR IC TESTING

(71) Applicant: Delta Design, Inc., Poway, CA (US)

(72) Inventors: Kexiang Ken Ding, San Diego, CA (US); Keith Emery, San Diego, CA (US); Jerry Ihor Tustaniwskyj, Mission Viejo, CA (US); Michael Anthony Laver, El Cajon, CA (US); Samer Kabbani, Encinitas, CA (US)

(73) Assignee: Delta Design, Inc., Poway, CA (US)

( * ) Notice: Subject to any disclaimer, the term of this patent is extended or adjusted under 35 U.S.C. 154(b) by 531 days.

(21) Appl. No.: 14/329,172

(22) Filed: Jul. 11, 2014

(65) Prior Publication Data

US 2015/0015286 A1 Jan. 15, 2015

Related U.S. Application Data

(60) Provisional application No. 61/845,723, filed on Jul. 12, 2013.

(51) Int. Cl.
*G01R 31/28* (2006.01)

(52) U.S. Cl.
CPC ..... *G01R 31/2891* (2013.01); *G01R 31/2863* (2013.01); *G01R 31/2867* (2013.01)

(58) Field of Classification Search
None
See application file for complete search history.

(56) References Cited

U.S. PATENT DOCUMENTS

| 7,506,451 | B1* | 3/2009 | Ding | G01R 31/2891 |
| | | | | 33/286 |
| 8,134,276 | B2* | 3/2012 | Stalford | B81B 3/0059 |
| | | | | 310/306 |
| 2002/0135191 | A1* | 9/2002 | Bolotin | H01L 21/6838 |
| | | | | 294/185 |
| 2006/0154386 | A1* | 7/2006 | Cheng | G01R 1/045 |
| | | | | 438/15 |
| 2009/0289206 | A1* | 11/2009 | Ding | G01R 31/2891 |
| | | | | 250/559.1 |
| 2010/0017161 | A1* | 1/2010 | Ding | G01R 31/2891 |
| | | | | 702/94 |
| 2011/0010122 | A1* | 1/2011 | Ding | G06T 7/002 |
| | | | | 702/95 |
| 2012/0299609 | A1* | 11/2012 | Rutigliano | G01R 1/0735 |
| | | | | 324/750.03 |

* cited by examiner

*Primary Examiner* — Melissa Koval
*Assistant Examiner* — Felicia Farrow
(74) *Attorney, Agent, or Firm* — Foley & Lardner LLP (57) ABSTRACT

A vision alignment system for an integrated circuit device testing handler includes a head guiding ring configured to be attached to a pick-and-place device, the head guiding ring having an opening in which a device-under-test having a device contact array is locatable; a socket apparatus including: a fixed mounting frame, a moveable socket guiding ring, and a plurality of actuators configured to move the moveable socket guiding ring relative to the fixed mounting frame; and a visualization device configured to provide data relating to a position of the device contact array relative to the contactor pin array. The socket apparatus is configured to adjust a position of the head guiding ring by moving the moveable socket guiding ring while the head guiding ring is located in an opening of the moveable socket guiding ring to align the device contact array to the contactor pin array.

57 Claims, 4 Drawing Sheets

MICRO-VISION ALIGNMENT SYSTEM WITH GUIDING RINGS FOR IC TESTING

CROSS-REFERENCE TO RELATED APPLICATIONS

This application claims priority from U.S. Provisional Patent Application No. 61/845,723 filed Jul. 12, 2013, which is hereby incorporated by reference in its entirety.

BACKGROUND

The present disclosure relates generally to a vision alignment system for an integrated circuit (IC) device testing handler, and more specifically, to a micro-vision alignment system that includes guiding rings that aid in the alignment of contact arrays.

In order to test an IC device, the contact array of the IC device must be accurately aligned with a contactor pin array to ensure that all of the contactor pins engage with the contact array of the IC device. Existing alignment systems used to test IC devices may only use a traditional mechanical alignment at the tester side without cameras. This mechanical alignment can only control the alignment error in certain manufacturing tolerances and therefore is not accurate or precise. Systems which currently utilize vision alignment systems use x, y, and rotation stages have space limitations. Alternate systems utilize vision alignment with individual device pick-and-place mechanisms, and may further use one rotation stage per pick-and-place head. This system cannot have high accuracy or repeatability and is expensive.

Therefore, there is a need for an improved IC device testing handler.

SUMMARY

In one embodiment, a vision alignment system for an integrated circuit device testing handler is provided. The system comprises: a head guiding ring configured to be attached to a pick-and-place device, the head guiding ring having an opening in which a device-under-test having a device contact array is locatable; a socket apparatus comprising: a fixed mounting frame having an opening in which a contactor pin array is locatable, and a moveable socket guiding ring having an opening in which the head guiding ring is locatable, and at least four actuators configured to move the moveable socket guiding ring relative to the fixed mounting frame; and at least two visualization devices configured to provide data relating to a position of the device contact array relative to the contactor pin array. The socket apparatus is configured to adjust a position of the head guiding ring by moving the moveable socket guiding ring while the head guiding ring is located in the opening of the moveable socket guiding ring, the adjustment being based on data received from the visualization device, to align the device contact array to the contactor pin array.

In one aspect, the system comprising a plurality of the head guiding rings and a plurality of the socket apparatus.

In one aspect, the socket apparatus further comprises a precising mechanism configured to precise the head guiding ring to a leading corner and a leading edge of the moveable socket guiding ring.

In one aspect, the precising mechanism is a spring-loaded precising mechanism.

In one aspect, the precising mechanism is a spring-loaded shape memory alloy wire based precising mechanism.

In one aspect, the fixed mounting frame includes a plurality of frame fiducials used as points of reference by at least one of the visualization devices.

In one aspect, the head guiding ring includes a plurality of head fiducials used as points of reference by at least one of the visualization devices.

In one aspect, the socket apparatus further comprises a floating mechanism configured to allow the moveable socket guiding ring to move relative to the fixed mounting frame.

In one aspect, the floating mechanism includes a plurality of air bearings.

In one aspect, the at least four actuators are linear actuators.

In one aspect, the at least four actuators are shape memory alloy wire based actuators.

In one aspect, the at least four actuators are a motor based actuators.

In one aspect, the at least four actuators are piezoelectric based actuators.

In one aspect, the socket apparatus comprises at least two flexures in opposite corners of the socket apparatus, the at least two flexures supporting the moveable socket guiding ring.

In one aspect, the at least two flexures are L-shaped flexures.

In one aspect, the socket apparatus further comprises a locking mechanism configured to lock the moveable socket guiding ring relative to the fixed mounting frame.

In one aspect, the head guiding ring further comprises a precising mechanism configured to precise the head guiding ring to a leading corner and a leading edge of the moveable socket guiding ring.

In one aspect, the precising mechanism is a spring-loaded precising mechanism.

In one aspect, the precising mechanism is a spring-loaded shape memory alloy wire based precising mechanism.

In another embodiment, a method of using a vision alignment system for an integrated circuit device testing handler is provided. The method comprises: providing a system comprising: a head guiding ring configured to be attached to a pick-and-place device, the head guiding ring having an opening in which a device-under-test having a device contact array is locatable; a socket apparatus comprising: a fixed mounting frame having an opening in which a contactor pin array is located, a moveable socket guiding ring having an opening in which the head guiding ring is locatable, and at least four actuators configured to move the moveable socket guiding ring relative to the fixed mounting frame; and a visualization device configured to provide data relating to a position of the device contact array relative to the contactor pin array; picking up the device-under-test using the pick-and-place device such that the device-under-test is located in the opening of the head guiding ring; imaging the device-under-test using the visualization devices to obtain data relating to a position of the device contact array relative to the contactor pin array; locating the head guiding ring, with the device-under-test therein, in the opening of the moveable socket guiding ring; adjusting a position of the head guiding ring by moving the moveable socket guiding ring while the head guiding ring is located in the opening of the moveable socket guiding ring, the adjustment being based on data received from the visualization device, thereby aligning the device contact array to the contactor pin array.

In one aspect, the method further comprises a step of moving the device contact array through the moveable socket guiding ring and contacting the device contact array with the contactor pin array.

In one aspect, the method further comprises a step of calibrating the at least one actuator, comprising: placing the head guiding ring into the socket apparatus, precising a leading corner and a leading edge of the moveable socket guiding ring to the head guiding ring; using the visualization devices to image the opening of the head guiding ring with head fiducials on the head guiding ring; using the visualization devices to scale calibrations between the head fiducials and the opening of the head guiding ring and the at least one actuator; aligning the head fiducials with the at least one actuator to the contactor pin array by using the visualization device as a guide; recording at least a position of the at least four actuators; and recording a contactor pin array offset to the head fiducials, the head guiding ring, and frame fiducials at ambient temperature.

In one aspect, the method further comprises a step of calibrating the head guiding ring, comprising: attaching the head guiding ring to the pick-and-place device without the device-under-test attached; positioning the opening of the head guiding ring with head fiducials above the visualization device; imaging the opening of the head guiding ring; and recording an offset between the opening of the head guiding ring and the head fiducials.

In one aspect, the method further comprises a step of calibrating the head guiding ring for different temperatures, comprising: imaging the head guiding ring and the device-under-test with the visualization device; extracting an image model from the device contact array and head fiducials; comparing a distance of the head fiducial under a settled temperature to an ambient calibrated temperature for thermal compensations; and recording the image model with a head thermal expansion.

In one aspect, the method further comprises a step of calibrating the moveable socket guiding ring for different temperatures, comprising: imaging the contactor pin array and frame fiducials with the visualization device; comparing a distance from the frame fiducials to the contactor pin array under a settled temperature to the distance under an ambient calibrated temperature for thermal compensations; and recording an offset between the contactor pin array and the frame fiducials with a thermal expansion.

In one aspect, the system comprises a plurality of the head guiding rings and a plurality of the socket apparatus.

In one aspect, the socket apparatus further comprises a precising mechanism configured to precise the head guiding ring to a leading corner and a leading edge of the moveable socket guiding ring.

In one aspect, the precising mechanism is a spring-loaded precising mechanism.

In one aspect, the precising mechanism is a spring-loaded shape memory alloy wire based precising mechanism.

In one aspect, the fixed mounting frame includes a plurality of frame fiducials used as points of reference by at least one of the visualization devices.

In one aspect, the head guiding ring includes a plurality of head fiducials used as points of reference by at least one of the visualization devices.

In one aspect, the socket apparatus further comprises a floating mechanism configured to allow the moveable socket guiding ring to move relative to the fixed mounting frame.

In one aspect, the floating mechanism includes a plurality of air bearings.

In one aspect, the at least four actuators are linear actuators.

In one aspect, the at least four actuators are shape memory alloy wire based actuators.

In one aspect, the at least four actuators are motor based actuators.

In one aspect, the at least four actuators are piezoelectric based actuators.

In one aspect, the socket apparatus comprises at least two flexures in opposite corners of the socket apparatus, the at least two flexures supporting the moveable socket guiding ring.

In one aspect, the at least two flexures are L-shaped flexures.

In one aspect, the socket apparatus further comprises a locking mechanism configured to lock the moveable socket guiding ring relative to the fixed mounting frame.

In one aspect, the head guiding ring further comprises a precising mechanism configured to precise the head guiding ring to a leading corner and a leading edge of the moveable socket guiding ring.

In one aspect, the precising mechanism is a spring-loaded precising mechanism.

In one aspect, the precising mechanism is a spring-loaded shape memory alloy wire based precising mechanism.

DETAILED DESCRIPTION

Embodiments of the present invention will be described below with reference to the accompanying drawings. It should be understood that the following description is intended to describe exemplary embodiments of the invention, and not to limit the invention.

Referring generally to the figures, disclosed herein is a vision alignment system comprising a head guiding ring, a socket apparatus, and at least two visualization devices. Vision alignment systems may be used with an IC device testing handler. More specifically, the vision alignment system may be used to test IC device contact arrays, such as a ball, pin, or pad arrays. In order to test the IC device, the contact array of the device-under-test must be accurately aligned with a contactor pin array of the handler, such as a pogo pin array, to allow all of the pogo pins to touch the corresponding contact array of the device-under-test.

Vision alignment can measure any alignment error and correct alignment errors with the measurement. Typically, the errors within the measurement are much smaller than errors with mechanical alignment without the use of vision alignment. The vision alignment system utilizes linear actuators. The linear actuators increase the accuracy and repeatability of the system, as well as decrease the size and cost of the system. Further, since vision alignment is utilized with the present invention, issues regarding space limitations for vision alignment are overcome, further allowing the system to be used with any multiple set vision alignment device. Multiple set vision alignment is for multiple devices to contact the corresponding pogo arrays at the same time. Each set of the vision alignment system is for one device to contact to one pogo array. Additionally, the vision alignment system directly adjusts the device at the contactor location to increase the accuracy. The vision alignment system can be used to conduct multiple plunges at the same time.

Figure 1:
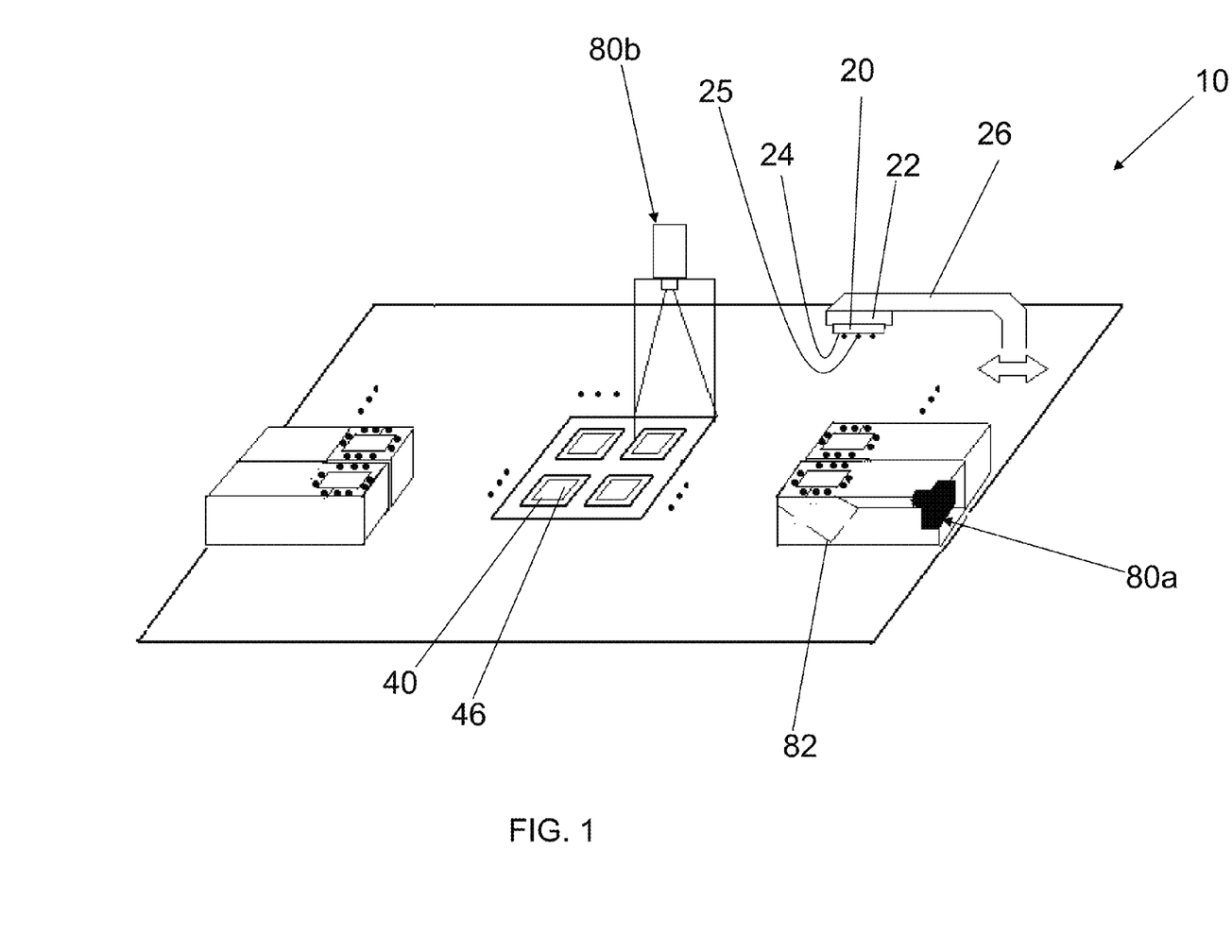
FIG. 1 is a perspective view of a vision alignment system according to one embodiment of the present invention.

FIG. 1 shows a vision alignment system 10 according to a first embodiment of the present invention. The vision alignment system 10 is used for IC device testing handlers and is able to detect and correct the alignment of a device contact array (for example, a ball grid array (BGA) 25) of a device-under-test 24. The device-under-test 24 is attached to a pick-and-place device 26 that moves the device-under-test 24 to various locations. The pick-and-place device 26 includes a head 22. A head guiding ring 20 is attached to the head 22. The device-under-test 24 is picked up by the pick-and-place device such that it is located within an opening of the head guiding ring 20.

A visualization device includes cameras 80 located on the top and sides of the vision alignment system 10 to give top and bottom view of various components within the vision alignment system 10. The visualization device provides data relating to a position of the device contact array relative to the contactor pin array 46. The bottom view camera 80a captures an image of the head guiding ring 20 and/or device-under-test 24 as it passes within the field of view of the camera 80a. The top view camera 80b captures an image of socket apparatus or components thereof, described in more detail below. A prism 82 allows the bottom view camera 80a to be located on the side of the vision alignment system 10 to image the bottom of the head guiding ring 20 and/or the device-under-test 24.

A plurality of socket apparatus 40 are located within the vision alignment system 10. A contactor pin array 46 is located within each of the socket apparatus 40.

Figure 2:
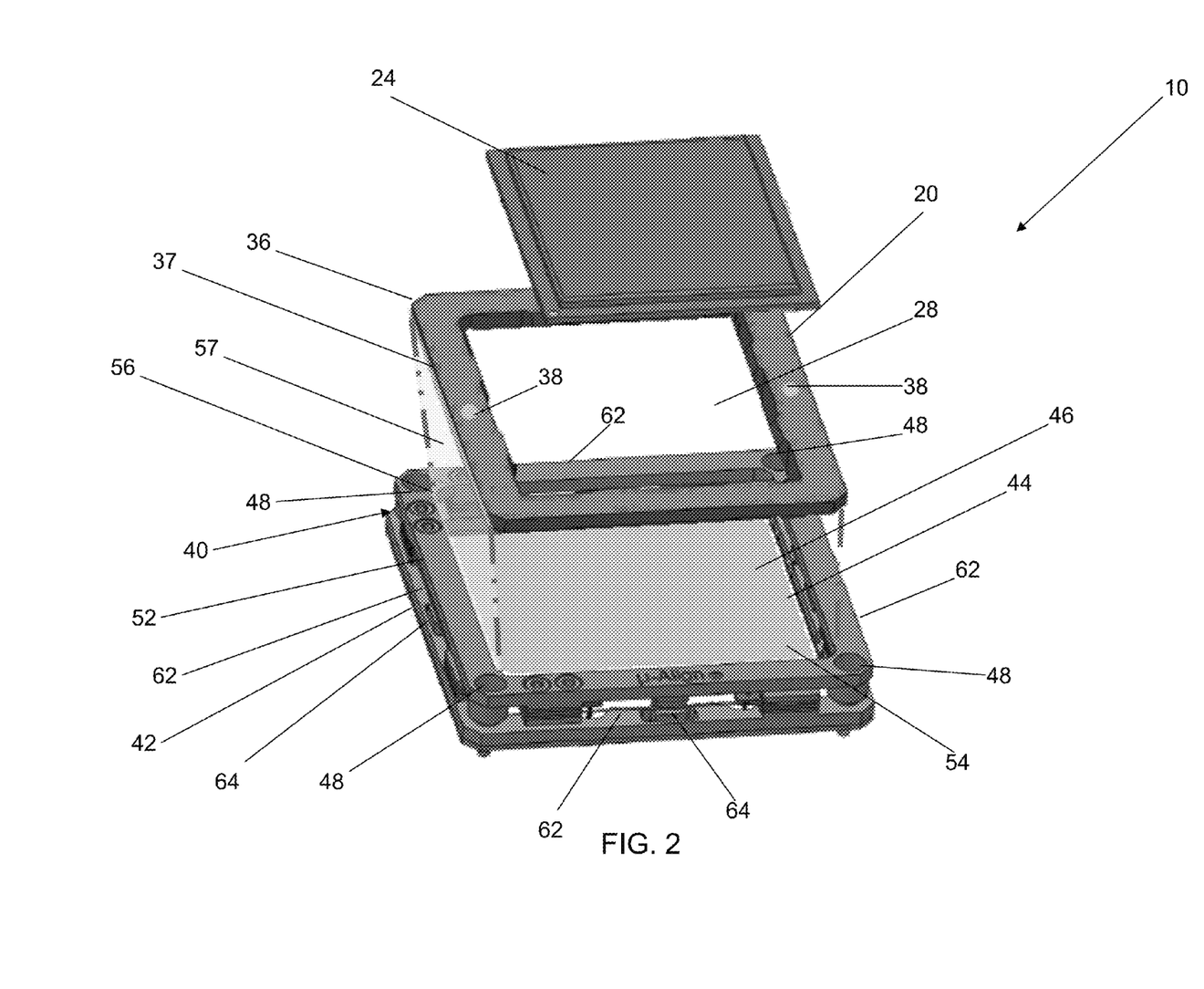
FIG. 2 is a perspective view of an alignment mechanism with a device-under-test, a head guiding ring, and a socket apparatus including a socket guiding ring according to one embodiment of the present invention.

FIG. 2 shows an alignment mechanism with a device-under-test 24, a head guiding ring 20, and a socket apparatus 40. The socket apparatus 40 is comprised of a fixed mounting frame 42, a moveable socket guiding ring 52, and at least four actuators 62.

The contactor pin array 46 is located within an opening 44 of the fixed mounting frame 42. Four linear actuators 62 are located on the fixed mounting frame 42. In this embodiment, the actuators 62 are shape memory alloy (SMA) wire based actuators with actuator encoders 64. The encoders 64 provide feedback of the position of the actuators to make the actuators more accurate and repeatable. A variety of different actuators 62 may be used, such as piezoelectric based actuators or motor based actuators. Additionally, four frame fiducials 48 may be located on the fixed mounting frame 42, as shown in FIG. 2.

The moveable socket guiding ring 52 is located above the fixed mounting frame 42 and has an opening 54 for the head guiding ring 20 to move into. The moveable socket guiding ring 52 includes a leading corner 56 and a leading edge 57. In this exemplary embodiment, by default, the leading corner 56 is the north-west corner and is defined as the origin of the leading coordinate. The leading edge 57 is the west edge of the socket apparatus 40 and is defined as the Y-axis of the leading coordinate.

The socket apparatus 40 may have a floating mechanism to allow the moveable socket guiding ring 52 to be freely aligned to the correct position relative to the fixed mounting frame 42. The floating mechanism may include, for example, air bearings. As shown, the socket apparatus 40 includes a locking mechanism to firmly lock the moveable socket guiding ring 52 relative to the fixed mounting frame 42. The moveable socket guiding ring 52 may be locked in the X and Y directions. The locking mechanism may include, for example, vacuum locks.

Figure 4:
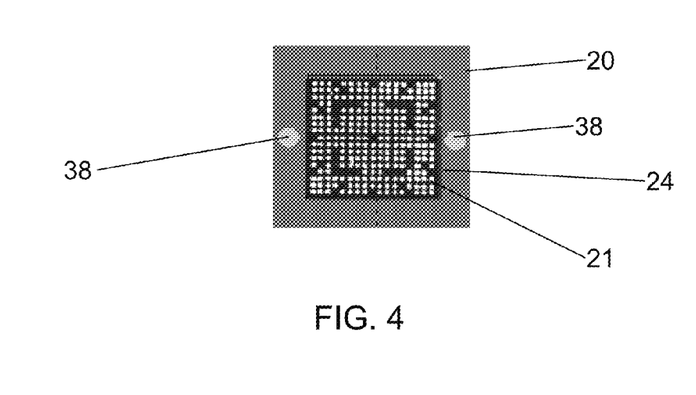
FIG. 4 is a bottom view of the head guiding ring and device-under-test of FIG. 2.

The device-under-test 24 with the device contact array is attached to the pick-and-place device 26 within an opening 28 of the head guiding ring 20. The device contact array 21 is imaged through the opening 28, as shown in FIG. 4. The leading corner 36 and the leading edge 37 of the head guiding ring 20 correspond with the leading corner 56 and the leading edge 57 of the moveable socket guiding ring 52. The head guiding ring 20 has at least one head fiducial 38. Two head fiducials 38 are shown in FIG. 2. These head fiducials 38, as well as the opening 28, may be imaged on both the top and bottom of the head guiding ring 20. These images may be used to calibrate the system with the location and orientation of the head guiding ring 20. Any perpendicularity error between the head fiducials 38 and the head guiding ring 20 surface will affect the accuracy of the vision alignment. To ensure the vision alignment accuracy, the error is calibrated out with the double side visible opening 28 of the head guiding ring 20. The contactor pin array 46 imaged by the contactor view camera 80b can be mapped to the double side visible head fiducial 38 (calibrated by the opening 28 of the head guiding ring 20) coordinate. Since the contact array of the device-under-test 24 imaged by the device view camera 80a can also be mapped to the double side visible head fiducial 38 coordinate, the X, Y and theta difference between the two arrays can be determined in the same fiducial coordinate system.

To use the vision alignment system 10 for an integrated circuit device testing handler, the device-under-test 24 is picked up by the pick-and-place device 26 such that the device-under-test 24 is located in the opening 28 of the head guiding ring 20. The device-under-test 24 within the head guiding ring 20 is then imaged by means of the visualization device 80a in order to obtain data regarding the position of the device-under-test 24 relative to the contractor pin array 46. To image the device-under-test 24, the pick-and-place device 26 passes within the field of view of the camera 80a the visualization device. The head guiding ring 20 is moved by the pick-and-place device 26 to the opening 54 of the moveable socket guiding ring 52.

Once the head guiding ring 20 is located within the opening 54 of the moveable socket guiding ring 52, a precising mechanism 66 precises the head guiding ring 20 to the leading corner 56 and a leading edge 57 of the moveable socket guiding ring 52. The precising mechanism 66 may be spring-loaded and/or SMA wire based. Then, the socket apparatus 40 adjusts the position of the head guiding ring 20 by moving the moveable socket guiding ring 52, based on data received from the visualization device 80b (as shown in FIG. 1), thereby aligning the device contact array 21 to the contactor pin array 46. The at least four actuators 62 may move the moveable guiding ring 52 to correct for the detected difference in position between the device-under-test 24 and the contactor pin array 46. Subsequently, a plunger head of the pick-and-place device 26 plunges the IC device through the moveable socket guiding ring 52 such that the device contact array of the IC device contacts the contactor pin array 46.

Figure 3:
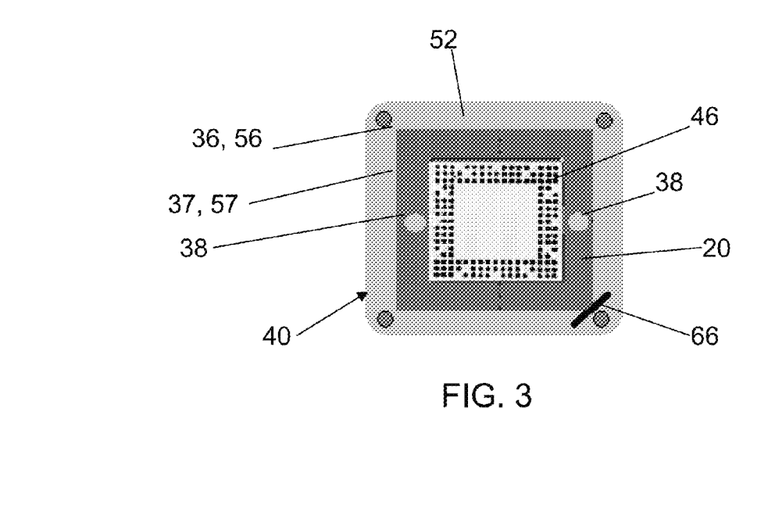
FIG. 3 is a top view of the head guiding ring and the socket apparatus including a socket guiding ring of FIG. 2.

FIG. 3 shows a top view of a contactor pin array 46, located within the socket apparatus 40. The moveable socket guiding ring 52 is shown in FIG. 3. The leading corner 36 and the leading edge 37 of the head guiding ring 20 is aligned with the leading corner 56 and the leading edge 57 of the moveable socket guiding ring 52. The head fiducials 38 are shown on either side of the head guiding ring 20.

An IC device system handler may include multiple pick- and place devices. The pick- and place devices may each include multiple heads, each with a head guiding ring. Each head may be configured to place an IC device into a corresponding one of the socket apparatus. Accordingly, the vision alignment system of one embodiment aligns multiple devices-under-test to multiple socket apparatus for parallel testing. For instance, the parallelism could be ×8, ×16, ×32, ×64, etc.

FIG. 4 shows a bottom view of the head guiding ring 20 in which the device-under-test 24 is shown with its device contact array 21. The head fiducials 38 are shown on either side of the head guiding ring 20.

Figure 5:
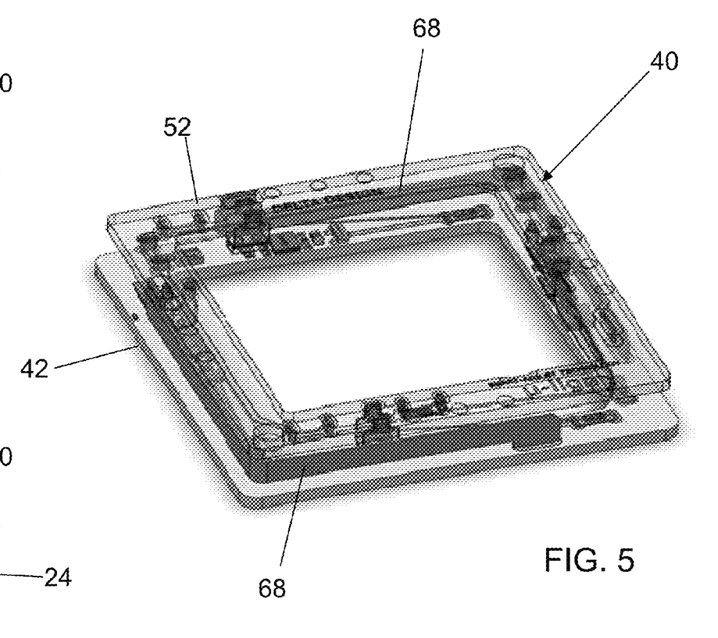
FIG. 5 is a perspective, see-through view of the socket apparatus of FIG. 2.

FIG. 5 shows the socket apparatus 40 with the moveable socket guiding ring 52 connected to the fixed mounting frame 42. Two "L" shaped flexures 68 are located in opposite corners of the socket apparatus 40. The flexures 68 may support the moveable socket guiding ring 52 and allow for three degrees of freedom with no sliding surfaces during the head guiding ring 20 position alignment. These flexures 68 may additionally be used to bias the SMA wire and further act as current carrying conductors for electrical routing, thereby eliminating wires between the fixed mounting frame 42 and the moveable socket guiding ring 52.

Figure 6:
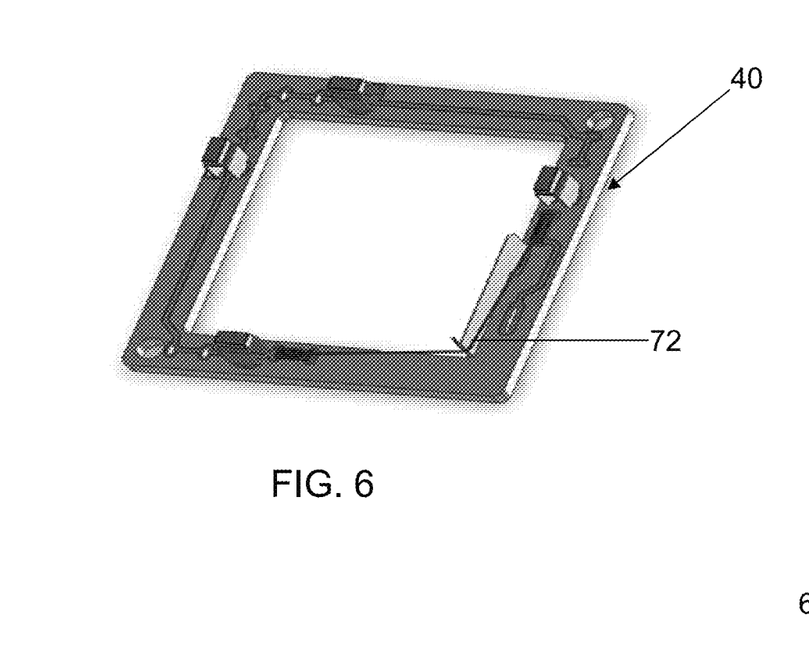
FIG. 6 is a perspective view of the preciser on the socket apparatus of FIG. 2.

FIG. 6 shows a wire precisor 72, which may be used as the precising mechanism within the socket apparatus 40. The wire precisor 72 may be used for precising the head guiding ring 20 and may include spring loaded SMA wires.

Figure 7:
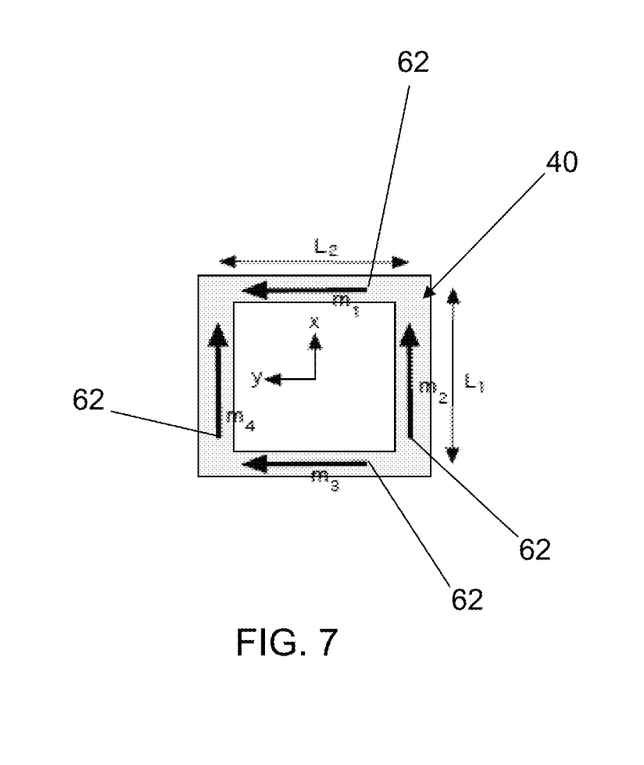
FIG. 7 is a top view of the actuator movement within the socket apparatus of FIG. 2.

FIG. 7 depicts the full X, Y, and theta movement of at least four actuators 62 within the socket apparatus 40. The at least four actuators 62 pull the socket apparatus 40 in the directions indicated. The average value of the two x-direction actuators may be used to correct the x position of the device in the guiding rings. The difference between the two actuators in the x direction may be used to correct the rotation angle of the device in the guiding rings. The y-direction actuators may use the same principles. With the feedback from the actuator encoder 64 (as shown in FIG. 2) and the "closed loop" system, this movement makes the actuating system more symmetrical.

One type of actuator 62 that may be used is a SMA wire based actuator, as shown in FIG. 2. The SMA wire based actuators help reduce the spacing requirement of the vision alignment system 10. The SMA wire based actuators are mounted at an angle from the fixed mounting frame 42 to the moveable socket guiding ring 52. This eliminates the need for larger brackets within the tightly-fit system. SMA wire based actuators are able to remember length changes in different temperatures and can be easily electronically controlled, as well as used for the vision alignment actuating. The SMA wire based actuator may be shrouded with Teflon tubing to allow the room temperature air to be ported around the SMA wire based actuators. This reduces the effect of ambient temperature changes and essentially keeps the SMA wire based actuators in its own temperature controlled environment. The diameter of the SMA wire based actuators is sufficiently small to be fit into the vision alignment system 10, while maximizing the strength to diameter ratio, as well as maximizing the opening 54 and opening 44 of the socket apparatus 40. Further, the cost of the SMA wire based actuators is less than motor and piezoelectric based actuators.

In another embodiment, the actuator 62 may be a piezo-electric based actuator with encode. The piezoelectric based actuator is also small and able to actuate with different electrical currents. The force load meets the actuating requirement of the vision alignment system 10. Additionally, piezoelectric based actuators are not as sensitive to the temperature environment as SMA wire based actuators are. There is less deflection and deformation than SMA wire based actuators, as well as less residues. Further, the piezoelectric based actuator react very quickly.

In another embodiment, the actuator 62 may be a motor based actuator or a micro-motor based actuator with encode. The motor based actuator has a larger moving range than a SMA wire based actuator or a piezoelectric based actuator. Additionally, the force load meets the actuating requirement of the vision alignment system 10. Further, the motor based actuator is not as sensitive to the temperature environment as a SMA wire based actuator.

In order to control the micro-alignment, the following transformation is used. The imaging and plunging sequences are provided. The micro-alignment system may use two actuators 62 in the X-direction and two actuators 62 in the Y-direction, as shown in FIG. 2.

$\tilde{m}$=a vector containing the at least four actuators
$\tilde{x}$=a vector containing the three actuator device displacements (x, y, θ)
$\tilde{A}$=a matrix used convert the actuator displacements to a device displacement $$\tilde{A} = \begin{bmatrix} a_{11} & a_{12} & a_{13} & a_{14} \\ a_{21} & a_{22} & a_{23} & a_{24} \\ a_{31} & a_{32} & a_{33} & a_{34} \end{bmatrix}; \tilde{m} = \begin{bmatrix} m_1 \\ m_2 \\ m_3 \\ m_4 \end{bmatrix}; \tilde{x} = \begin{bmatrix} x \\ y \\ \theta \end{bmatrix}$$

The relation between the at least four actuators 62 and the three-degree displacement is:

$$\tilde{A}\tilde{m} = \tilde{x}$$

Define:

$$x = \frac{C_2 m_2 + C_4 m_4}{2} = 0*m_1 + \frac{1}{2}C_2 m_2 + 0*m_3 + \frac{1}{2}C_4 m_4$$

$$y = \frac{C_1 m_1 + C_3 m_3}{2} = \frac{1}{2}C_1 m_1 + 0*m_2 + \frac{1}{2}C_3 m_3 + 0*m_4$$

$$\tan\theta = C_5 \frac{1}{2}\left(\frac{C_1 m_1 - C_3 m_3}{L_1} + \frac{C_2 m_2 - C_4 m_4}{L_2}\right)$$

$\tan\theta \approx \theta$ (for small $\theta$)

$$\theta = \frac{C_5 C_1}{2L_1}m_1 + \frac{C_5 C_2}{2L_2}m_2 - \frac{C_5 C_3}{2L_1}m_3 - \frac{C_5 C_4}{2L_2}m_4$$

therefore:

$$\tilde{A} = \begin{bmatrix} a_{11} & a_{12} & a_{13} & a_{14} \\ a_{21} & a_{22} & a_{23} & a_{24} \\ a_{31} & a_{32} & a_{33} & a_{34} \end{bmatrix} = \begin{bmatrix} 0 & \frac{C_2}{2} & 0 & \frac{C_4}{2} \\ \frac{C_1}{2} & 0 & \frac{C_3}{2} & 0 \\ \frac{C_5 C_1}{2L_1} & \frac{C_5 C_2}{2L_2} & -\frac{C_5 C_3}{2L_1} & -\frac{C_5 C_4}{2L_2} \end{bmatrix}$$

Where:

$C_n$=equals conversion factor from encoder (bits) to desired length unit (μm, mm, etc.) for wire n (n=1 to 4)

$C_5$=equals conversion factor from radians to desired angle units (degrees, mrads, etc.)

$L_1$ & $L_2$=distance between SMA wires $m_n$=equals the displacement for wire n (n=1 to 4)

Note that ideally $C_1=C_2=C_3=C_4$ and for square alignment stations $L_1=L_2$.

To calibrate the at least four actuators 62, the head guiding ring 20 is placed into the socket apparatus and the leading corner 56 and the leading edge 57 of the moveable socket guiding ring 52 are précised to the head guiding ring 20, as shown in FIG. 3. Using the visualization device 80a, the opening 28 of the head guiding ring 20 is imaged with the head fiducials 38 on the head guiding ring 20 to calibrate the actuator scale. The visualization device 80a is used to scale calibrations between the head fiducials 38 and the opening 28 of the head guiding ring 20 and the at least four actuators 62. The head fiducials 38 are aligned with the at least four actuators 62 to the contactor pin array 46 by using the visualization device 80b as a guide. The actuator 62 positions are recorded after the alignment to be used later. The contactor pin array 46 offsets to the head fiducials 38, the head guiding ring 20, and the frame fiducials 48 at ambient temperature are also recorded.

To calibrate the head guiding ring 20, the head guiding ring 20 is attached to the pick-and-place device 26 without the device-under-test 24 attached. The opening 28 of the head guiding ring 20 with the head fiducials 38 is positioned above the visualization device 80a. The opening 28 of the head guiding ring 20 is imaged to calibrate the head fiducials 38 in the X, Y, and theta directions with the visualization device 80a. The offset between the opening 28 of the head guiding ring 20 and the head fiducials 38 is recorded.

To calibrate the head guiding ring 20 for different temperatures, the head guiding ring 20 and the device-under-test 24 are imaged with the visualization device 80a. An image model is extracted from the device contact array 21 and the head fiducials 38. The distance of the head fiducials 38 under a settled temperature is compared to an ambient calibrated temperature for thermal compensations. Finally, the image model with head thermal expansion is recorded.

To calibrate the moveable socket guiding ring 52 for different temperatures, the contactor pin array 46 and the frame fiducials 48 are imaged with the visualization device 80b. The distance from the frame fiducials 48 to the contactor pin array under a settled temperature is compared to an ambient calibrated temperature for thermal compensations. The offset between the contactor pin array 46 and the frame fiducials 48 with a thermal expansion is recorded.

The visualization devices may include lighting devices and software with vision alignment algorithms.

Each top view camera and lighting device may be assembled in one box. Alternatively, multiple top view cameras and light devices may be assembled into the same box to lower the cost. The top view camera may be mounted to the pick-and-place device. Alternatively, the top view camera may be used offline and only installed in the system when calibration is required in order to reduce weight and cost.

In another embodiment, the socket apparatus may be mounted above the contactor pin array. Alternative actuating systems, such as voice coil actuators, may be used.

The precising mechanism may be located on either the socket apparatus or the head guiding ring.

A software sequence for the vision alignment may be provided, in which the imaging and plunging sequences previously described may be used. This may be non-stop plunging for speed or stop plunging for accuracy.

While the above-described embodiment describes a system in which the socket apparatus includes at least four actuators, in other embodiment, fewer actuators (for example, three actuators) may be used.

While the preferred embodiments of the devices and methods have been described in reference to the environment in which they were developed, they are merely illustrative of the principles of the inventions. Modification or combinations of the above-described assemblies, other embodiments, configurations, and methods for carrying out the invention, and variations of aspects of the invention that are obvious to those of skill in the art are intended to be within the scope of the claims. In addition, where this application has listed the steps of a method or procedure in a specific order, it may be possible, or even expedient in certain circumstances, to change the order in which some steps are performed, and it is intended that the particular steps of the method or procedure claim set forth below not be construed as being order-specific unless such order specificity is expressly stated in the claim.

What is claimed is:

1. A vision alignment system for an integrated circuit device testing handler, the system comprising:
    a head guiding ring configured to be attached to a pick-and-place device, the head guiding ring having an opening in which a device-under-test having a device contact array is locatable, the opening extending entirely through the head guiding ring, such that the opening is visible from both a top side and a bottom side of the head guiding ring;
    a socket apparatus comprising:
        a fixed mounting frame having an opening in which a contactor pin array is locatable,
        a moveable socket guiding ring having an opening in which the head guiding ring is locatable, and
        a plurality of actuators configured to move the moveable socket guiding ring relative to the fixed mounting frame; and
    first and second visualization devices configured to provide data relating to a position of the device contact array relative to the contactor pin array, wherein the first visualization device is configured to view the bottom of the head guiding when the head guiding ring is attached to the pick-and-place device, and the second visualization device is configured to view the top of the head guiding ring when the head guiding ring is located in the opening of the moveable socket guiding ring,
    wherein the socket apparatus is configured to adjust a position of the head guiding ring by moving the moveable socket guiding ring while the head guiding ring is located in the opening of the moveable socket guiding ring, the adjustment being based at least on data received from the second visualization device, to align the device contact array to the contactor pin array.

2. The system according to claim 1, wherein the system comprises a plurality of the head guiding rings and a plurality of the socket apparatus.

3. The system according to claim 1, wherein the socket apparatus further comprises a precising mechanism configured to precise the head guiding ring to a leading corner and a leading edge of the moveable socket guiding ring.

4. The system according to claim 3, wherein the precising mechanism is a spring-loaded precising mechanism.

5. The system according to claim 4, wherein the precising mechanism is a spring-loaded shape memory alloy wire based precising mechanism.

6. The system according to claim 1, wherein the fixed mounting frame includes a plurality of frame fiducials used as points of reference by the second visualization device.

7. The system of claim 1, wherein the head guiding ring includes a plurality of head fiducials used as points of reference by the first and second visualization devices.

8. The system of claim 1, wherein the socket apparatus further comprises a floating mechanism configured to allow the moveable socket guiding ring to move relative to the fixed mounting frame.

9. The system according to claim 8, wherein the floating mechanism includes a plurality of air bearings.

10. The system according to claim 1, wherein the actuators are linear actuators.

11. The system according to claim 1, wherein the actuators are shape memory alloy wire based actuators.

12. The system according to claim 1, wherein the actuators are a motor based actuators.

13. The system according to claim 1, wherein the actuators are piezoelectric based actuators.

14. The system according to claim 1, wherein the socket apparatus comprises at least two flexures in opposite corners of the socket apparatus, the at least two flexures supporting the moveable socket guiding ring.

15. The system according to claim 14, wherein the at least two flexures are L-shaped flexures.

16. The system according to claim 1, wherein the socket apparatus further comprises a locking mechanism configured to lock the moveable socket guiding ring relative to the fixed mounting frame.

17. The system according to claim 1, wherein the head guiding ring further comprises a precising mechanism configured to precise the head guiding ring to a leading corner and a leading edge of the moveable socket guiding ring.

18. The system according to claim 17, wherein the precising mechanism is a spring-loaded precising mechanism.

19. The system according to claim 18, wherein the precising mechanism is a spring-loaded shape memory alloy wire based precising mechanism.

20. The system according to claim 1, wherein the socket apparatus includes at least four of the actuators configured to move the moveable socket guiding ring relative to the fixed mounting frame.

21. A method of using a vision alignment system for an integrated circuit device testing handler, the method comprising:
providing a system comprising:
a head guiding ring configured to be attached to a pick-and-place device, the head guiding ring having an opening in which a device-under-test having a device contact array is locatable, the opening extending entirely through the head guiding ring, such that the opening is visible from both a top side and a bottom side of the head guiding ring;
a socket apparatus comprising:
a fixed mounting frame having an opening in which a contactor pin array is located,
a moveable socket guiding ring having an opening in which the head guiding ring is locatable, and
a plurality of actuators configured to move the moveable socket guiding ring relative to the fixed mounting frame; and
first and second visualization devices configured to provide data relating to a position of the device contact array relative to the contactor pin array, wherein the first visualization device is configured to view the bottom of the head guiding when the head guiding ring is attached to the pick-and-place device, and the second visualization device is configured to view the top of the head guiding ring when the head guiding ring is located in the opening of the moveable socket guiding ring;
picking up the device-under-test using the pick-and-place device such that the device-under-test is located in the opening of the head guiding ring;
imaging the device-under-test using the first visualization device to obtain data relating to a position of the device contact array relative to the contactor pin array;
locating the head guiding ring, with the device-under-test therein, in the opening of the moveable socket guiding ring;
imaging the device-under-test using the second visualization device while the head guiding ring and device-under-test are in the opening of the moveable socket guiding ring; and
adjusting a position of the head guiding ring by moving the moveable socket guiding ring while the head guiding ring is located in the opening of the moveable socket guiding ring, the adjustment being based at least on data received from the second visualization device, thereby aligning the device contact array to the contactor pin array.

22. The method according to claim 21, further comprising a step of moving the device contact array through the moveable socket guiding ring and contacting the device contact array with the contactor pin array.

23. The method according to claim 21, further comprising a step of calibrating the at least one actuator, comprising:
placing the head guiding ring into the socket apparatus;
precising a leading corner and a leading edge of the moveable socket guiding ring to the head guiding ring;
using the first visualization device to image the opening of the head guiding ring with head fiducials on the head guiding ring;
using the second visualization device to scale calibrations between the head fiducials and the opening of the head guiding ring and the at least one actuator;
aligning the head fiducials with the at least one actuator to the contactor pin array by using the at least one visualization device as a guide;
recording at least a position of the at least four actuators; and
recording a contactor pin array offset to the head fiducials, the head guiding ring, and frame fiducials at ambient temperature.

24. The method according to claim 21, further comprising a step of calibrating the head guiding ring, comprising:
attaching the head guiding ring to the pick-and-place device without the device-under-test attached;
positioning the opening of the head guiding ring with head fiducials above the first visualization device;
imaging the opening of the head guiding ring with the first visualization device; and
recording an offset between the opening of the head guiding ring and the head fiducials.

25. The method according to claim 21, further comprising a step of calibrating the head guiding ring for different temperatures, comprising:
imaging the head guiding ring and the device-under-test with the first visualization device;

extracting an image model from the device contact array and head fiducials;

comparing a distance of the head fiducial under a settled temperature to an ambient calibrated temperature for thermal compensations; and recording the image model with a head thermal expansion.

26. The method according to claim 21, further comprising a step of calibrating the moveable socket guiding ring for different temperatures, comprising:

imaging the contactor pin array and frame fiducials with the second visualization device;

comparing a distance from the frame fiducials to the contactor pin array under a settled temperature to the distance under an ambient calibrated temperature for thermal compensations; and recording an offset between the contactor pin array and the frame fiducials with a thermal expansion.

27. The method according to claim 21, wherein the system comprises a plurality of the head guiding rings and a plurality of the socket apparatus.

28. The method according to claim 21, wherein the socket apparatus further comprises a precising mechanism configured to precise the head guiding ring to a leading corner and a leading edge of the moveable socket guiding ring.

29. The method according to claim 28, wherein the precising mechanism is a spring-loaded precising mechanism.

30. The method according to claim 29, wherein the precising mechanism is a spring-loaded shape memory alloy wire based precising mechanism.

31. The method according to claim 21, wherein the fixed mounting frame includes a plurality of frame fiducials used as points of reference by the second visualization device.

32. The method of claim 21, wherein the head guiding ring includes a plurality of head fiducials used as points of reference by the first and second visualization devices.

33. The method of claim 21, wherein the socket apparatus further comprises a floating mechanism configured to allow the moveable socket guiding ring to move relative to the fixed mounting frame.

34. The method according to claim 33, wherein the floating mechanism includes a plurality of air bearings.

35. The method according to claim 21, wherein the actuators are linear actuators.

36. The method according to claim 21, wherein the actuators are shape memory alloy wire based actuators.

37. The method according to claim 21, wherein the actuators are motor based actuators.

38. The method according to claim 21, wherein the actuators are piezoelectric based actuators.

39. The method according to claim 21, wherein the socket apparatus comprises at least two flexures in opposite corners of the socket apparatus, the at least two flexures supporting the moveable socket guiding ring.

40. The method according to claim 39, wherein the at least two flexures are L-shaped flexures.

41. The method according to claim 21, wherein the socket apparatus further comprises a locking mechanism configured to lock the moveable socket guiding ring relative to the fixed mounting frame.

42. The method according to claim 21, wherein the head guiding ring further comprises a precising mechanism configured to precise the head guiding ring to a leading corner and a leading edge of the moveable socket guiding ring.

43. The method according to claim 42, wherein the precising mechanism is a spring-loaded precising mechanism.

44. The method according to claim 43, wherein the precising mechanism is a spring-loaded shape memory alloy wire based precising mechanism.

45. The method according to claim 21, wherein the socket apparatus includes at least four of the actuators configured to move the moveable socket guiding ring relative to the fixed mounting frame.

46. A vision alignment system for an integrated circuit device testing handler, the system comprising:

a head guiding ring configured to be attached to a pick-and-place device, the head guiding ring having an opening in which a device-under-test having a device contact array is locatable;

a socket apparatus comprising:

a fixed mounting frame having an opening in which a contactor pin array is locatable, a moveable socket guiding ring having an opening in which the head guiding ring is locatable, and a plurality of shape memory alloy wire based actuators configured to move the moveable socket guiding ring relative to the fixed mounting frame; and at least one visualization device configured to provide data relating to a position of the device contact array relative to the contactor pin array, wherein the socket apparatus is configured to adjust a position of the head guiding ring by moving the moveable socket guiding ring while the head guiding ring is located in the opening of the moveable socket guiding ring, the adjustment being based on data received from the at least one visualization device, to align the device contact array to the contactor pin array.

47. The system according to claim 46, wherein the system comprises a plurality of the head guiding rings and a plurality of the socket apparatus.

48. The system according to claim 46, wherein the socket apparatus further comprises a precising mechanism configured to precise the head guiding ring to a leading corner and a leading edge of the moveable socket guiding ring.

49. The system according to claim 48, wherein the precising mechanism is a spring-loaded precising mechanism.

50. The system according to claim 49, wherein the precising mechanism is a spring-loaded shape memory alloy wire based precising mechanism.

51. The system according to claim 46, wherein the fixed mounting frame includes a plurality of frame fiducials used as points of reference by the at least one visualization device.

52. The system of claim 46, wherein the head guiding ring includes a plurality of head fiducials used as points of reference by the at least one visualization device.

53. The system of claim 46, wherein the socket apparatus further comprises a floating mechanism configured to allow the moveable socket guiding ring to move relative to the fixed mounting frame.

54. The system according to claim 53, wherein the floating mechanism includes a plurality of air bearings.

55. The system according to claim 46, wherein the socket apparatus comprises at least two flexures in opposite corners of the socket apparatus, the at least two flexures supporting the moveable socket guiding ring.

56. The system according to claim 55, wherein the at least two flexures are L-shaped flexures.

57. The system according to claim 46, wherein the socket apparatus further comprises a locking mechanism configured to lock the moveable socket guiding ring relative to the fixed mounting frame.

* * * * *